(12) United States Patent
Chauhan et al.

(10) Patent No.: US 11,598,795 B1
(45) Date of Patent: Mar. 7, 2023

(54) TWO-TEMPERATURE TRIMMING FOR A VOLTAGE REFERENCE WITH REDUCED QUIESCENT CURRENT

(71) Applicant: Texas Instruments Incorporated, Dallas, TX (US)

(72) Inventors: Rajat Chauhan, Mahadevapura (IN); Sandeep Shylaja Krishnan, Kerala (IN); Joseph Alan Sankman, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/464,261

(22) Filed: Sep. 1, 2021

Related U.S. Application Data

(60) Provisional application No. 63/260,265, filed on Aug. 13, 2021, provisional application No. 63/232,311, filed on Aug. 12, 2021.

(51) Int. Cl.
*H03F 3/45* (2006.01)
*G01R 19/22* (2006.01)

(52) U.S. Cl.
CPC ........... *G01R 19/22* (2013.01); *H03F 3/4517* (2013.01); *H03F 3/45269* (2013.01)

(58) Field of Classification Search
CPC .... H03F 3/45; H03F 3/45071; H03F 3/45076; H03F 3/4517; H03F 3/45179; H03F 3/45269; H03F 2203/45284; H03F 2200/468; G05F 1/46; G05F 1/461; G05F 1/462; G05F 1/463; G05F 1/56; G05F 3/02; G05F 3/08; G05F 3/10; G05F 3/16; G05F 3/20; G05F 3/24; G05F 3/242; G05F 3/245; G01R 19/22
See application file for complete search history.

(56) References Cited

U.S. PATENT DOCUMENTS 10,838,443 B2 * 11/2020 Rasmus ................... G05F 3/30
11,255,930 B2 * 2/2022 Jiang ................... G01R 33/077

* cited by examiner

*Primary Examiner* — Long Nguyen
(74) *Attorney, Agent, or Firm* — Ray A. King; Frank D. Cimino

(57) ABSTRACT

In an example method of trimming a voltage reference circuit, the method includes: setting the circuit to a first temperature; trimming a first resistor ($R_{DEGEN}$) of a differential amplifier stage of the circuit; and trimming a first resistor (R1) of a scaling amplifier stage of the circuit. The trimming equalizes current flow through the differential amplifier stage and the scaling amplifier stage. The method includes: trimming a second resistor (R2) of the scaling amplifier stage to set an output voltage of the circuit to a target voltage at the first temperature; setting the circuit to a second temperature; and trimming a second resistor ($R_{PTAT}$) of the differential amplifier stage, a third resistor ($R1_{PTAT}$) of the scaling amplifier stage, and a fourth resistor ($R2_{PTAT}$) of the scaling amplifier stage to set the output voltage of the circuit to the target voltage at the second temperature.

23 Claims, 7 Drawing Sheets

TWO-TEMPERATURE TRIMMING FOR A VOLTAGE REFERENCE WITH REDUCED QUIESCENT CURRENT

CROSS-REFERENCE TO RELATED APPLICATIONS

This application claims priority to U.S. Provisional Patent Application No. 63/232,311 filed Aug. 12, 2021 and U.S. Provisional Patent Application No. 63/260,265 filed Aug. 13, 2021, which are incorporated herein by reference.

TECHNICAL FIELD

This description relates to voltage reference circuits, and more particularly to techniques for two-temperature trimming of voltage reference circuits with reduced quiescent current.

BACKGROUND

Precision voltage reference circuits are designed to provide a voltage output that is reliably accurate and stable over a specified temperature range, compared to the voltage provided by a conventional power supply. These voltage reference circuits are useful in many applications, including environment sensing applications and medical applications, where relatively small or weak signals need to be measured, which requires higher resolution analog to digital converters (ADCs) that operate from an accurate and stable voltage source. Also, many of these applications are implemented as battery powered, portable, or remote devices, and thus power consumption is a concern. As such, relatively low quiescent current is often specified as a requirement for a given voltage reference circuit.

SUMMARY

In an example method of trimming a voltage reference circuit, the method includes: setting the circuit to a first temperature; trimming a first resistor ($R_{DEGEN}$) of a differential amplifier stage of the circuit; and trimming a first resistor (R1) of a scaling amplifier stage of the circuit. The trimming equalizes current flow through the differential amplifier stage and the scaling amplifier stage. The method includes: trimming a second resistor (R2) of the scaling amplifier stage to set an output voltage of the circuit to a target voltage at the first temperature; setting the circuit to a second temperature; and trimming a second resistor ($R_{PTAT}$) of the differential amplifier stage, a third resistor ($R1_{PTAT}$) of the scaling amplifier stage, and a fourth resistor ($R2_{PTAT}$) of the scaling amplifier stage to set the output voltage of the circuit to the target voltage at the second temperature.

BRIEF DESCRIPTION OF THE DRAWINGS

FIG. 6 illustrates simulation results showing output voltage stability over temperature for the voltage reference circuit of FIG. 4 after two-temperature trimming.

DETAILED DESCRIPTION

Figure 1:
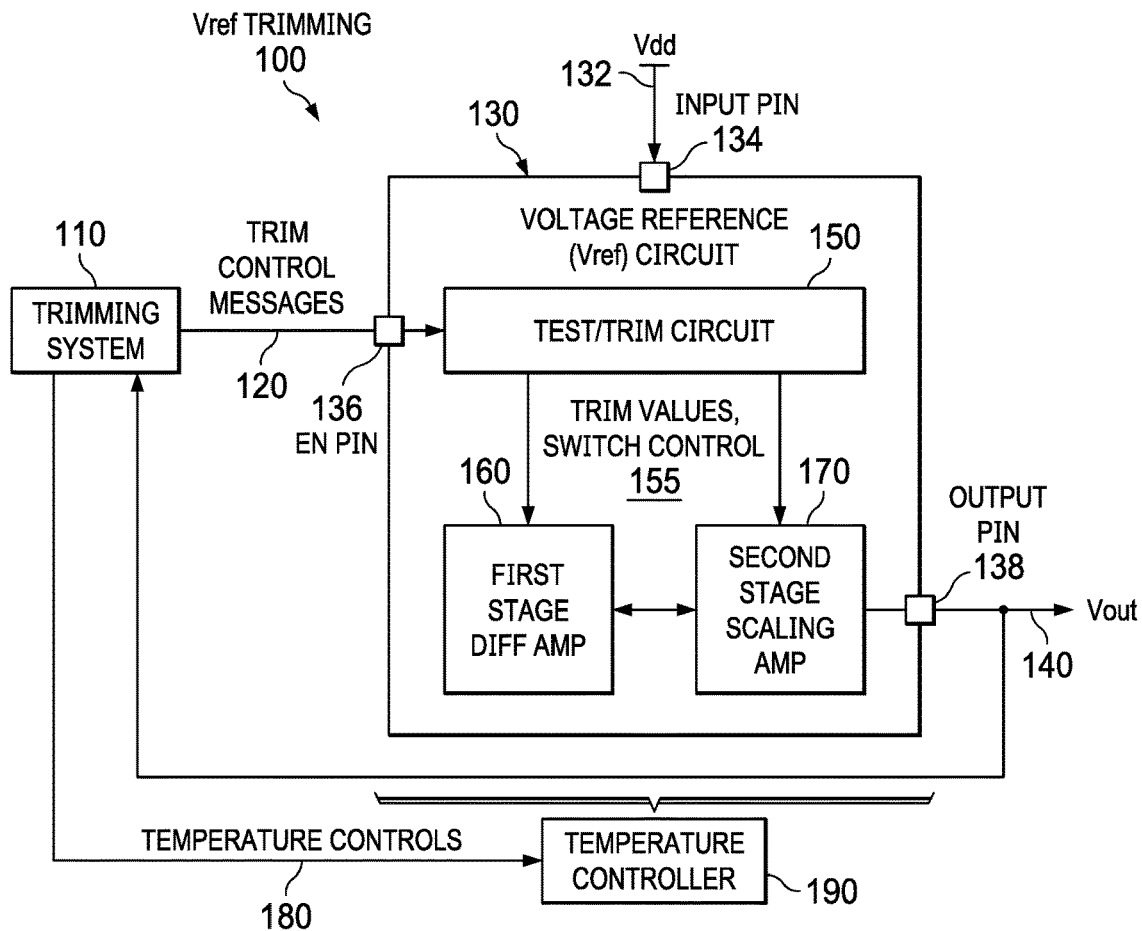
FIG. 1 is a top-level block diagram of a system for two-temperature trimming of a voltage reference.

Techniques are described herein for two-temperature trimming of voltage reference circuits with low quiescent current draw. As described above, many applications require precision voltage reference circuits that can provide a voltage output that is reliably accurate and stable over a specified temperature range, compared to the voltage provided by a conventional power supply. Also, many of these applications are implemented as battery powered, portable, or remote devices, which require reduced or otherwise efficient power consumption and thus lower quiescent current (Iq) draw.

Accordingly, low Iq voltage reference circuitry is described herein, along with a methodology for two-temperature trimming of the voltage reference circuit to reduce output voltage variability over temperature. In some embodiments, the two-temperature trimming process may be performed as part of the manufacturing process, such as during a final test stage of the voltage reference circuit. In some embodiments, the voltage reference circuit is implemented as an integrated circuit (IC), either as a stand-alone or dedicated voltage reference circuit, or as part of an overall broader circuit (e.g., such as an ADC).

The voltage reference circuit is useful in a wide variety of applications, such as sensors and ADCs, particularly when employed in battery powered or remote devices. More generally, the described techniques are useful for any systems which require an accurate and stable voltage source that consumes relatively low power.

In this description, a voltage reference circuit includes a differential amplifier stage and a scaling amplifier stage. The differential amplifier stage, which is configured to generate a control signal to control the scaling amplifier stage, includes a first resistor (feedback degeneration resistor—$R_{DEGEN}$) and a second resistor (through which current flow is proportional to absolute temperature—$R_{PTAT}$). The scaling amplifier stage is coupled to the differential amplifier stage and configured to generate a reference voltage at an output port of the voltage reference circuit based on a scaled version of the control signal. The scaling amplifier stage includes a number of scaling resistors: a first resistor (R1); a second resistor (R2); a third resistor ($R1_{PTAT}$); and a fourth resistor ($R2_{PTAT}$). Resistors $R_{DEGEN}$ and R1 are configured to be trimmed or adjusted to equalize current flow through the differential amplifier stage and the scaling amplifier stage, at a first temperature. Resistor R2 is configured to be trimmed to set the output port voltage to the reference voltage at the first temperature. Resistors $R_{PTAT}$, R1 PTAT, and $R2_{PTAT}$ are configured to be trimmed to set the output port voltage to the reference voltage at a second temperature, as described below.

Also, in this description, a method for trimming the voltage reference circuit includes setting the circuit to a first temperature; trimming the first resistor ($R_{DEGEN}$) of the differential amplifier stage of the circuit and trimming the first resistor (R1) of the scaling amplifier stage of the circuit to equalize current flow through the differential amplifier stage and the scaling amplifier stage. The method also includes trimming the second resistor (R2) of the scaling amplifier stage to set the output voltage of the circuit to a target voltage at the first temperature. The method includes setting the circuit to a second temperature and trimming the second resistor ($R_{PTAT}$) of the differential amplifier stage and the third and fourth resistors ($R1_{PTAT}$ and $R2_{PTAT}$) of the scaling amplifier stage to set the output voltage of the circuit to the target voltage at the second temperature, as described below.

The techniques described herein may provide improved two-temperature trimming, compared to existing voltage references that require additional circuit components (particularly additional active components such as transistors that consume current, even in a quiescent state) to perform temperature trimming operations. Also, the described voltage reference circuit does not require additional pinouts to perform the trimming operations, thus maintaining footprint compatibility with industry standard products, simplifying manufacturing, and reducing cost. The described voltage reference circuitry can thus provide an accurate and temperature stable output voltage with reduced Iq operation.

General Overview

FIG. 1 is a top-level block diagram 100 of a system for two-temperature trimming of a voltage reference. The block diagram 100 shows the trimming system 110, the voltage reference (Vref) circuit 130, and a temperature controller 190. In some embodiments, the Vref circuit 130 may be implemented as an IC. Trimming system 110 is configured to provide trim control messages 120 to the Vref circuit 130, to adjust trimming resistors of the Vref circuit 130, as described below. Trimming control is based in part on the output voltage (Vout) 140 of the Vref circuit 130, which is provided as feedback to the trimming system 110. Trimming system 110 is also configured to provide temperature controls 180 to the temperature controller 190 to raise and/or lower the temperature of the Vref circuit 130 for each stage of the trimming process.

The Vref circuit 130 includes a test/trim control circuit 150, a first stage differential amplifier 160, and a second stage scaling amplifier 170. The operation of these circuits is described below, but at a high level, the first stage differential amplifier 160 and second stage scaling amplifier 170 are configured to transform an input voltage Vdd 132, provided at input pin 134, to an output voltage Vout 140, provided to output pin 138. The output voltage Vout 140 should be relatively near the desired target reference voltage and should be relatively stable over the operating temperature range of the voltage reference circuit 130. The test/trim circuit 150 is configured to decode trim control messages 120, provided to the IC as a serial bit stream through enable pin 136, and perform any actions needed to trim one or more resistors of the Vref circuit 130 responsive to those messages.

In some embodiments, the test/trim control circuit 150 includes a processor and/or control logic and memory. The processor or control logic can decode the trim control messages to extract an identifier of the resistor to be trimmed and a trimming value to be used. After the resistor is trimmed to a desired value, that value may be stored in the memory, so the resistor trimming value can be refreshed at a future time if needed. In some embodiments, the processor is configured to recognize an activation code which signals that additional bits transmitted through the enable pin are to be interpreted as resistor trimming messages. The activation code can serve as a password to limit use of the test/trim control circuit 150, so an end user of the circuit does not change the trimming values.

Figure 2:
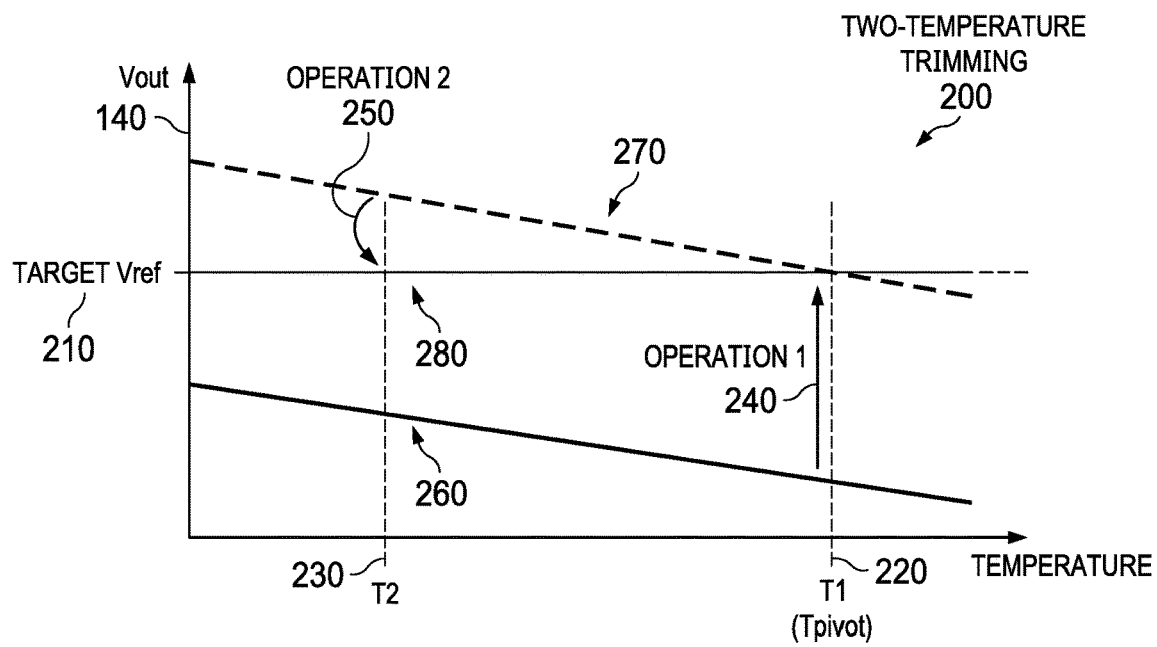
FIG. 2 is a graph that illustrates improvement in output voltage stability over temperature at each stage of the trimming process.

FIG. 2 is a graph 200 that illustrates improvement in output voltage stability over temperature at each stage of the trimming process. The ideal (or target) reference voltage is shown as dotted line 210, which is constant over the operating temperature range of the voltage reference circuit. However, initial testing of the device after fabrication may show that the output voltage follows a curve 260 which has an offset from the target voltage 210 and exhibits a slope over the temperature range. This can occur for any number of reasons, such as imperfections in the fabrication process, component tolerances, and other reasons. The two-temperature trimming process is employed to reduce the offset and slope. The first operation, 240, of the two-temperature trimming process, sets the temperature of the Vref circuit to T1 220, and then trims a first set of resistors, of the Vref circuit, to scale the output voltage to the target reference voltage 210 at temperature T1. This first trimming operation is also referred to herein as accuracy trimming. Temperature T1 is also referred to as the pivot temperature, or Tpivot. The result is shown as curve 270, in which the slope remains, but the offset has been removed. Next, at operation 250, the temperature of the Vref circuit is adjusted to T2 230, and a second set of resistors, of the Vref circuit, are trimmed to scale the output voltage to the target reference voltage 210 at temperature T2, without inducing any additional shift in the output voltage at temperature T1. The effect is to remove the slope of the curve 270 or pivot that curve about the Tpivot temperature point. This second trimming operation is also referred to herein as slope trimming. The resulting curve 280 substantially aligns with the target reference voltage curve 210. In some embodiments, temperature points T1 and T2 may be selected based on the operational temperature range of the Vref circuit. Although curves 260, 270, and 280 are shown as straight lines for simplicity of illustration, in practice those lines have some relatively small degree of curvature (such as in FIG. 6). In some embodiments, this curvature, due to second order effects, may be corrected through additional techniques.

Circuit Architecture

Figure 3:
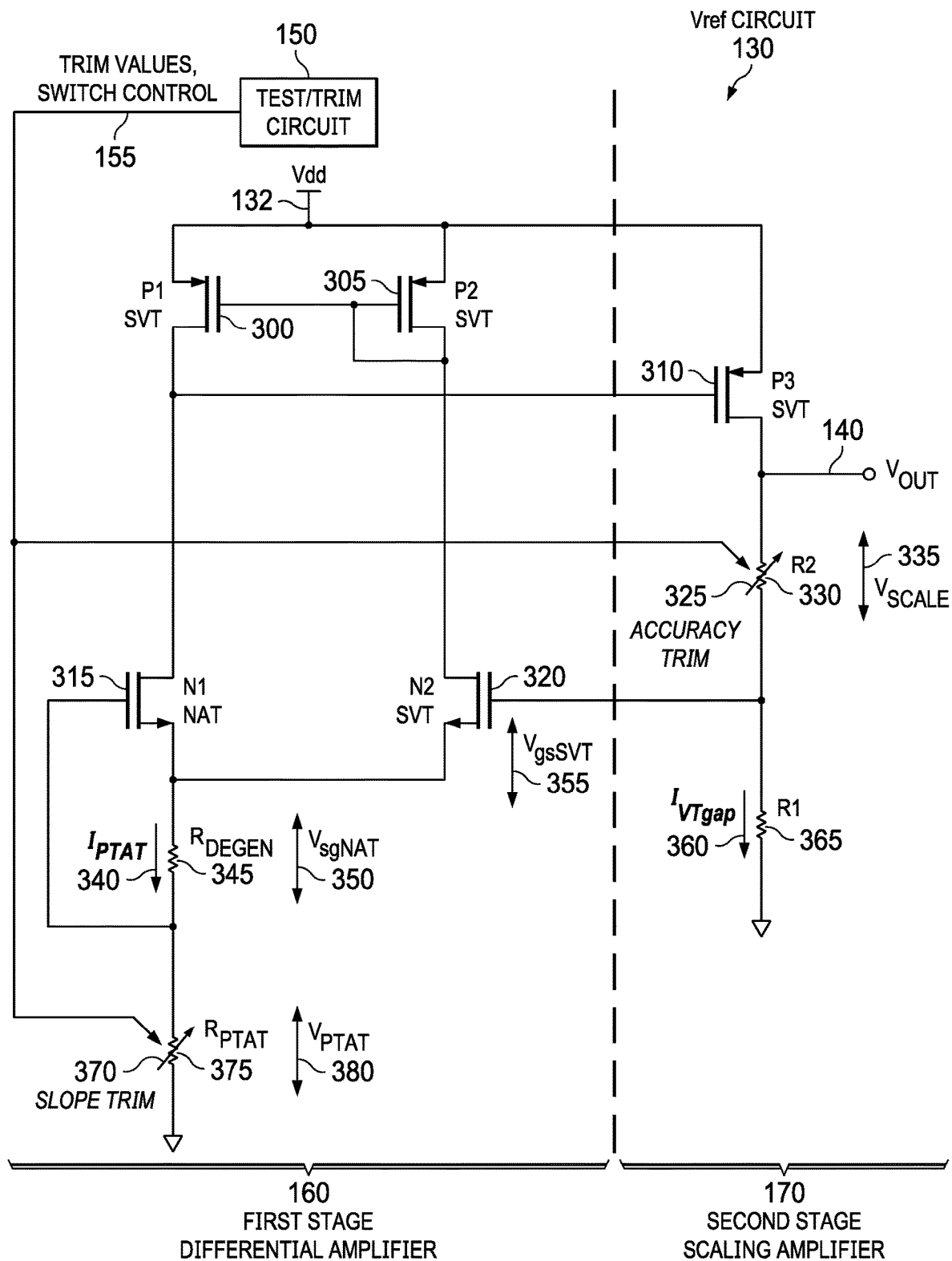
FIG. 3 is a schematic diagram of a voltage reference circuit.

FIG. 3 is a schematic diagram of a voltage reference circuit 130. The first stage differential amplifier 160 includes a first p-channel metal oxide semiconductor field effect transistor (PFET) P1 300, a second PFET P2 305, a first n-channel metal oxide semiconductor field effect transistor (NFET) N1 315, a second NFET N2 320, a degeneration resistor $R_{DEGEN}$ 345, and a current-flow-proportional-to-absolute-temperature resistor $R_{PTAT}$ 375.

The second stage scaling amplifier 170 includes a third PFET P3 310 and scaling resistors R2 330 and R1 365.

Transistors N1 and N2 are input transistors for the differential amplifier stage, and transistor P1 and P2 are load transistors for the differential amplifier stage. Transistor P3 is the input transistor for the scaling amplifier stage and is driven by a control signal, the output of the differential amplifier, which is coupled to the gate of P3 as shown. Also, the output of the scaling amplifier stage connects back to the differential amplifier input at the gate of N2, creating a feedback loop that sets the voltage at the gate of N2 equal to the source to gate voltage of N1 plus the gate to source voltage of N2 plus the voltage drop across $R_{PTAT}$.

In some embodiments, transistors P1, P2, P3 and N2 are standard voltage threshold transistors, having a voltage threshold of +600 millivolts (mV) within +/−10%, and transistor N1 is a natural voltage threshold transistor, having a voltage threshold of −200 mV within +/−10%. A voltage threshold gap, VTgap, is the difference between the gate voltage of N1 and the gate voltage of N2, which can be expressed as the sum of $V_{SgNAT}$ 350 and $V_{gsSVT}$ 355.

As described below, R2 is configured to provide accuracy trimming at Tpivot by adjusting Vscale 335, the voltage difference between Vout 140 and the gate voltage of N2. Likewise, $R_{PTAT}$ is configured to provide slope trimming at T2 by adjusting $V_{PTAT}$ 380, the voltage difference between the gate of N1 and ground. These trimming operations are described herein with reference to the circuit diagram of FIG. 3 as follows.

As shown in the circuit diagram, the current flowing through $R_{DEGEN}$, $I_{PTAT}$ 340, can be expressed as:

$$I_{PTAT} = \left(\frac{V_{sgNAT}}{R_{DEGEN}}\right),$$

and the current flowing through R1, $I_{VTgap}$ 360, can be expressed as:

$$I_{VTgap} = \left(\frac{I_{PTAT} * R_{PTAT} + VT_{gap}}{R_1}\right),$$

and the voltage Vout can be expressed as a sum of the voltages $V_{PTAT}$ 380, $V_{sgNAT}$ 350, $V_{gsSVT}$ 355, and Vscale 335:

$$V_{OUT} = V_{PTAT} + V_{sgNAT} + V_{gsSVT} + V_{scale}$$

The expression for Vout can thus be rewritten as:

$$V_{OUT} = \left(V_{sgNAT} \frac{R_{PTAT}}{R_{DEGEN}} + VT_{gap}\right) * \left(1 + \frac{R_2}{R_1}\right)$$

The first operation in the two-temperature trimming process is to trim $R_{DEGEN}$ and R1, so $I_{PTAT}$ is set equal to $R_{DEGEN}$. This results in the following condition:

$$I_{VTgap} = \left(\frac{VT_{gap}}{R_1 - R_{PTAT}}\right)$$

After the currents are equalized (to within a selected tolerance), R2 330 can be trimmed by an accuracy trimming value 325 to provide the initial accuracy adjustment for Vout at the Tpivot temperature, so Vout is adjusted to the target reference voltage. Then, at the T2 temperature, $R_{PTAT}$ 375 can be trimmed by slope trim value 370 to readjust Vout at the new temperature and provide the slope adjustment. Also, R1 is also trimmed by the same slope trim value 370. Because $I_{PTAT}$ and $I_{VTgap}$ have been equalized, the trimming of R1 by the same value as $R_{PTAT}$ prevents a change in $I_{VTgap}$ at the Tpivot temperature due to the change in $R_{PTAT}$. Finally, R2 is trimmed by the negative of the slope trim value 370. Because $I_{VTgap}$ has no change, this trimming of R2 cancels out any shift in Vout at the Tpivot temperature that would have otherwise resulted from the change in $R_{PTAT}$.

An example of the effects of the two-temperature trimming process on the Vref circuit (for example, at temperatures 90° C. and 27° C.) is described below:

1. Set temperature to Tpivot (90° C.)
2. Adjust $R_{DEGEN}$ and R1, so $I_{PTAT}$ equals $I_{VTgap}$ $$I_{VTgap@90°C.} = I_{PTAT@90°C.} = \left(\frac{VT_{gap@90°C.}}{R_1 - R_{PTAT}}\right)$$

3. At Tpivot (90° C.), move Vout to target Vref by adjusting R2, using accuracy trim $$V_{out@90°C.} = (I_{PTAT} * R_{PTAT} + VT_{gap@90°C.}) * \left(1 + \frac{R_2}{R_1}\right)$$

$$= \left(\frac{VT_{gap@90°C.}}{R_1 - R_{PTAT}} * R_{PTAT} + VT_{gap@90°C.}\right) * \left(\frac{R_1 + R_2}{R_1}\right)$$

$$= VT_{gap@90°C.} * \left(\frac{R_1 + R_2}{R_1 - R_{PTAT}}\right)$$

$$= Vref_{target}$$

4. Change temperature to T2 (27C)
5. Adjust $R_{PTAT}$ by ΔR to move Vout to target Vref $$V_{out@27°C.} = Vref_{target}$$

However, this will also move $V_{out@90°C.}$:

$$V_{out@90°C.} = VT_{gap@90°C.} * \left(\frac{R_1 + R_2}{R_1 - (\Delta R + R_{PTAT})}\right)$$

6. To avoid this shift in $V_{out@90°C.}$, adjust R2 by −ΔR and adjust R1 by ΔR.

$$V_{out@90°C.} = VT_{gap@90°C.} * \left(\frac{R_1 + \Delta R + R_2 - \Delta R}{R_1 + \Delta R - (\Delta R + R_{PTAT})}\right)$$

$$= VT_{gap@90°C.} * \left(\frac{R_1 + R_2}{R_1 - R_{PTAT}}\right)$$

$$= Vref_{target}$$

Figure 4:
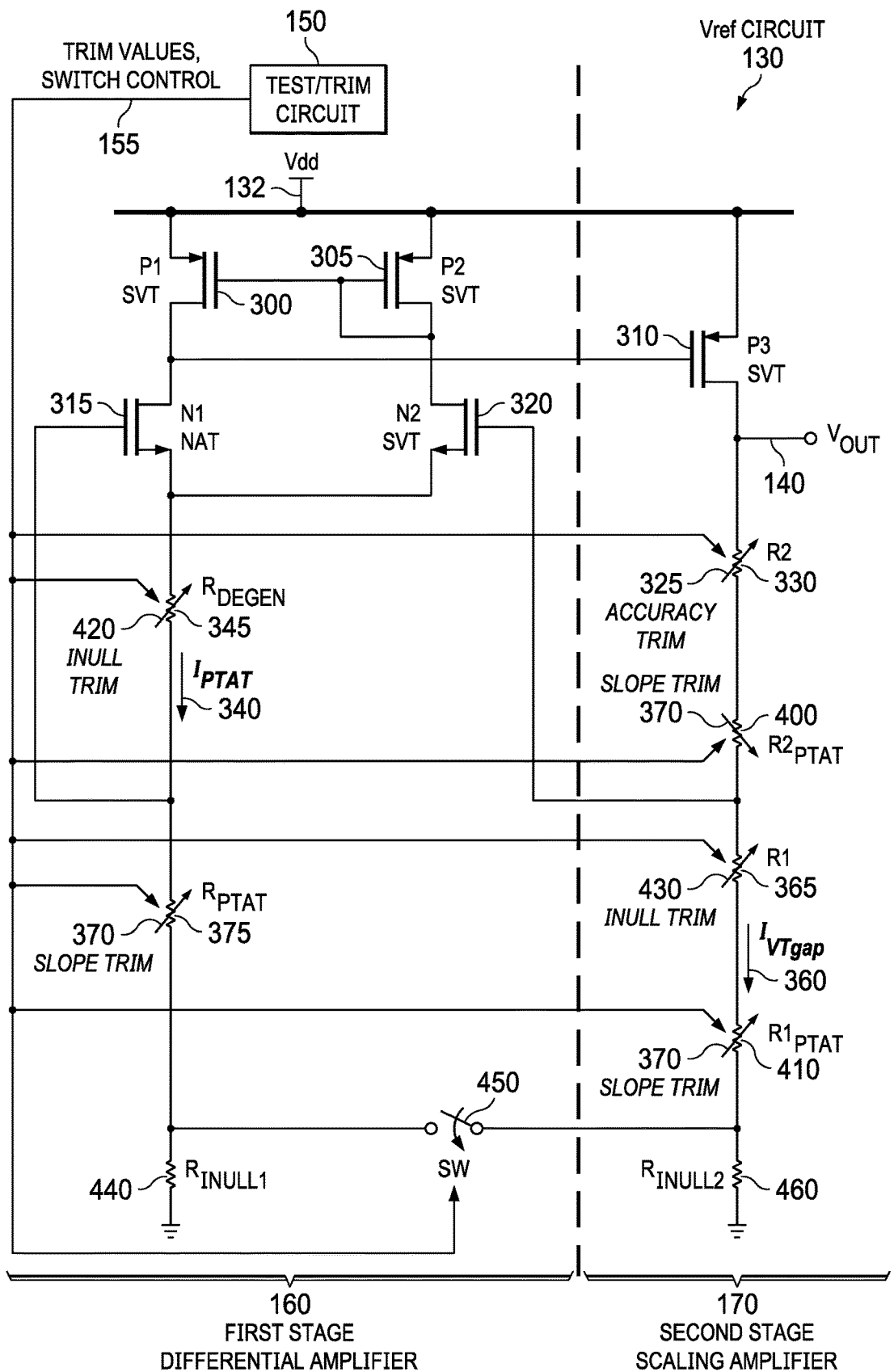
FIG. 4 is a detailed schematic diagram of the voltage reference circuit of FIG. 3, configured in another embodiment.

FIG. 4 is a detailed schematic diagram of the voltage reference circuit 130, of FIG. 3, configured in another embodiment. In this example, an additional resistor $R2_{PTAT}$ 400 is coupled in series with resistor R2 330, and an additional resistor $R1_{PTAT}$ 410 is coupled in series with resistor R1. Accordingly, resistor R1 of FIG. 3 is configured as two resistors, R1 and $R1_{PTAT}$, and resistor R2 of FIG. 3 is configured as two resistors R2 and $R2_{PTAT}$.

In the above description of the Vref circuit 130, in association with FIG. 3, resistors R1 and R2 were trimmed twice, first at temperature Tpivot and then again at temperature T2. The first adjustments were made to equalize currents and perform accuracy trimming at temperature Tpivot, while the second adjustments were made to ensure that Vout at Tpivot does not change after $R_{PTAT}$ is trimmed at temperature T2.

However, based on the additional detail shown in FIGS. 4, R1 and R2 are each adjusted only once, at temperature Tpivot (to equalize currents and perform accuracy trimming). Subsequent adjustments, to ensure that Vout at Tpivot does not change after $R_{PTAT}$ is trimmed at temperature T2, are performed by trimming resistors $R1_{PTAT}$ and $R2_{PTAT}$ at temperature T2. In some embodiments, resistors $R1_{PTAT}$ and $R2_{PTAT}$ are configured to lock trimming of these resistors to the trimming of resistor $R_{PTAT}$. For example, if $R_{PTAT}$ is trimmed by ΔR (for slope trimming 370), then $R1_{PTAT}$ is also trimmed by ΔR, and $R2_{PTAT}$ is trimmed by −ΔR. Accordingly, if $R_{PTAT}$ and $R1_{PTAT}$ are increased by ΔR, then $R2_{PTAT}$ is reduced by ΔR.

The more detailed schematic diagram FIG. 4 also illustrates that the Vref circuit 130 is configured to allow for the determination of equalized current flow ($I_{RDEGEN}$ and $I_{VTgap}$ through the differential amplifier stage and the scaling amplifier stage, respectively), by monitoring Vout 140. Repurposing an existing pin (output pin 138) for this purpose avoids the need to add an additional pin to the IC to detect current equalization, and thus reduces cost and complexity. Additional components are shown to enable this feature, including current nulling resistors $R_{INULL1}$ 440 and $R_{INULL2}$ 460, along with switch SW 450. $R_{INULL1}$ and $R_{INULL2}$ are substantially equal in resistance value. Accordingly, if currents $I_{PTAT}$ and $I_{VTgap}$ are equalized, then the voltage across the switch SW will be zero, irrespective of whether the switch is open or closed. Thus, if no change is detected in Vout when the switch SW is toggled between open and closed states, it can be determined that the currents are equalized. In some embodiments, the switch can be controlled in the same manner as resistance trimming, through the application of a message formatted as serial bit stream provided through enable pin 136, such as trim control message 120.

Figure 5:
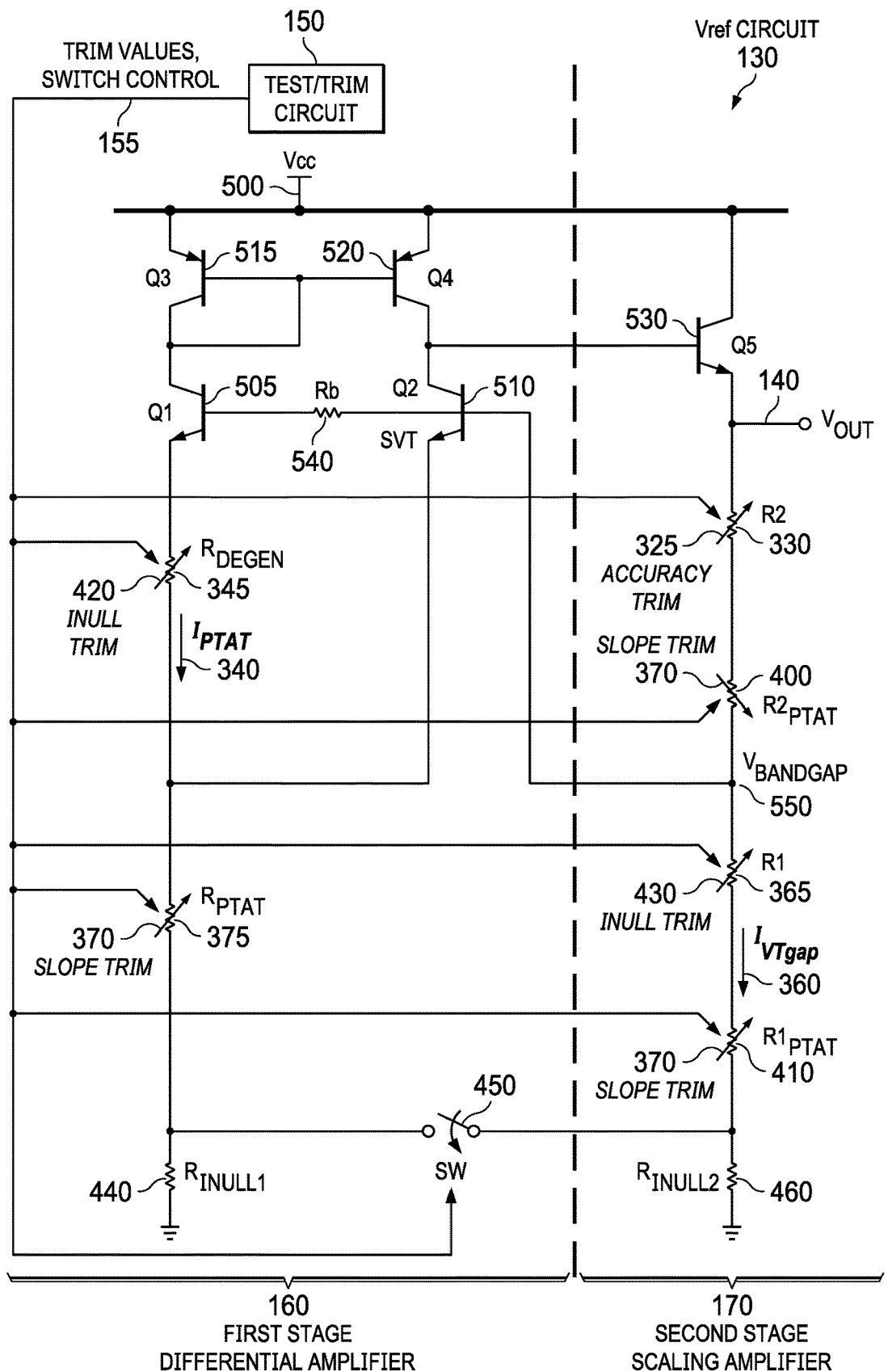
FIG. 5 is a detailed schematic diagram of the voltage reference circuit of FIG. 3, configured in yet another embodiment.

FIG. 5 is a detailed schematic diagram of the voltage reference circuit 130 of FIG. 3, configured in yet another embodiment. The above described embodiments of FIGS. 3 and 4 have field effect transistors (FETs) in the amplifier stages. The alternative embodiment of FIG. 5 illustrates that bipolar junction transistors (BJTs) may be used instead of FETs. The first stage differential amplifier includes BJTs Q1 505, Q2 510, Q3 515, and Q4 520 arranged in a Brokaw bandgap cell configuration, where the base ports of Q1 and Q2 are coupled through a resistor Rb 540. Also, the second stage scaling amplifier employs BJT Q5 530 as an alternative to a FET.

In this embodiment, Vout can be expressed as:

$$V_{OUT} = V_{bandgap} * \left(1 + \frac{R_2 + R_{2PTAT}}{R_1 + R_{1PTAT} + R_{INULL}}\right)$$

where Vbandgap is shown as 550 on the circuit. The trimming portion of the voltage reference circuit (the trimming resistors and switch) remains unchanged, as does the trimming procedure.

Methodology

Figure 6:
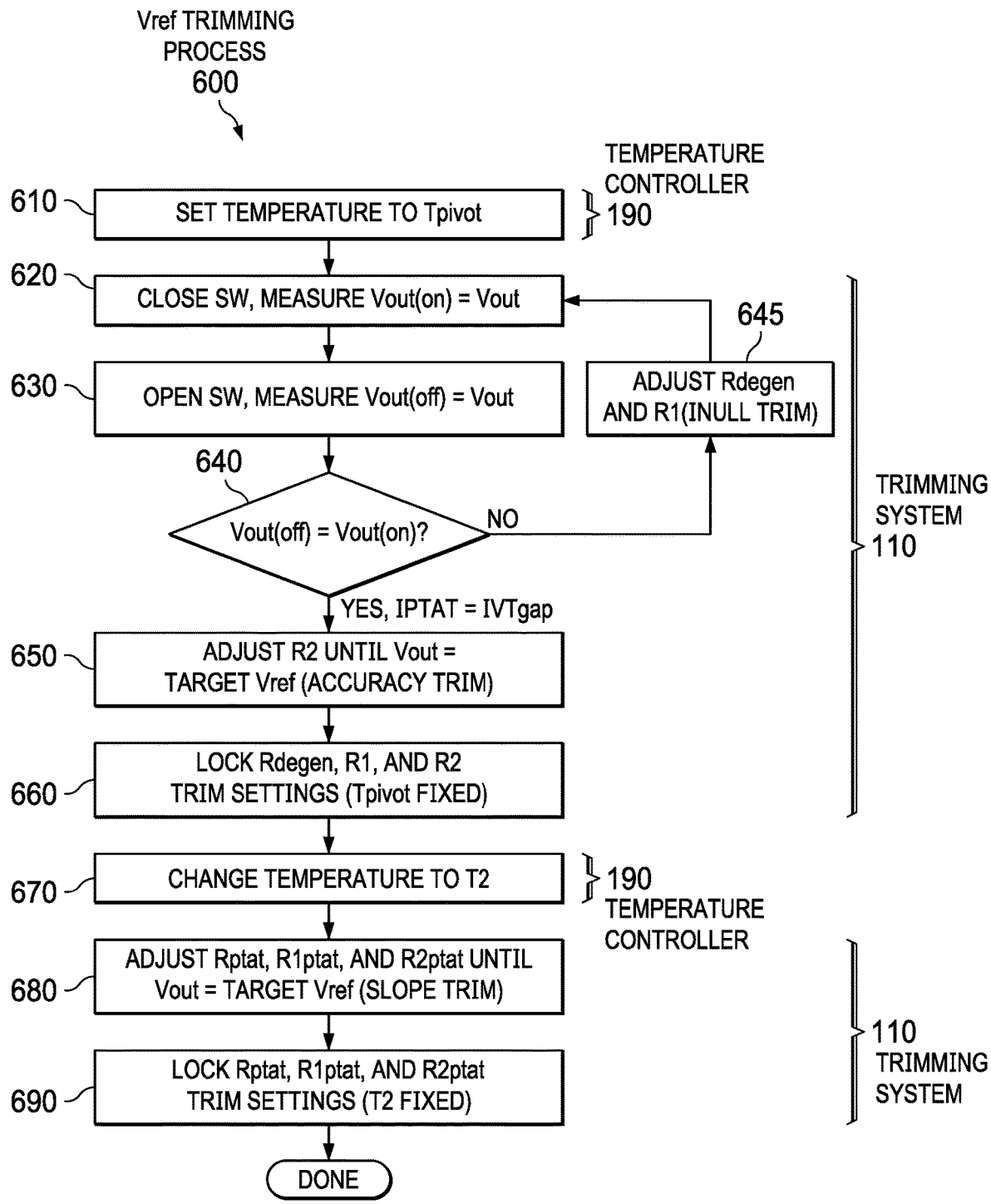
FIG. 6 illustrates a methodology for two-temperature trimming of the voltage reference circuit of FIG. 4 or 5.

FIG. 6 illustrates a methodology 600 for two-temperature trimming of the voltage reference circuit of FIG. 4 or 5. As shown, example method 600 includes a number of phases and sub-processes, the sequence of which may vary from one embodiment to another. However, when considered in aggregate, these phases and sub-processes form a process for two-temperature trimming, in certain of the embodiments described herein, such as illustrated in FIGS. 1-4, as described above. However, other system architectures can be used in other embodiments. Accordingly, the correlation of the various functions shown in FIG. 6 to the specific components illustrated in the drawings does not imply any structural and/or use limitations. Instead, other embodiments may include varying degrees of integration, in which multiple functions are effectively performed by one system.

In one embodiment, the process begins at operation 610, by setting the temperature of the Vref circuit to Tpivot. At operation 620, the switch SW 450 is closed, and the output voltage 140 is measured as Vout(on). At operation 630, the switch SW 450 is opened, and the output voltage 140 is measured as Vout(off).

At operation 640, Vout(off) is compared to Vout(on). If they differ (to within a selected tolerance), then methodology 600 determines that the current flowing through $R_{INULL1}$ 440 is not equal to the current flowing through $R_{INULL2}$ 460. In that case, at operation 645, null current trimming (inull trimming 420, 430) is performed by adjusting $R_{DEGEN}$ 345 and R1 365, and the process repeats at operation 620 until Vout(off) equals Vout(on).

Otherwise, when Vout(off) and Vout(on) are substantially equal, methodology 600 determines the currents are also substantially equal, and $I_{PTAT}$ 340 equals $I_{VTgap}$ 360. The process then continues, at operation 650, with accuracy trimming 325 in which R2 330 is adjusted until Vout substantially equals the target Vref (to within a selected tolerance). At operation 660, the trim settings for $R_{DEGEN}$ 345, R1 365, and R2 330 are locked, and the voltage output at temperature Tpivot is fixed. In some examples, trim settings may be locked by saving the values in a memory of the test/trim circuit 150.

Next, at operation 670, the temperature of the Vref circuit is set to T2. At operation 680, slope trimming 370 is performed by adjusting $R_{PTAT}$ 375, $R1_{PTAT}$ 410, and $R2_{PTAT}$ 400 until Vout again substantially equals the target Vref (to within a selected tolerance). At operation 690, the trim settings for $R_{PTAT}$, $R1_{PTAT}$, and $R2_{PTAT}$ are also locked, so the voltage output at temperature T2 is fixed, and the process is completed.

Simulation Results

Figure 7:
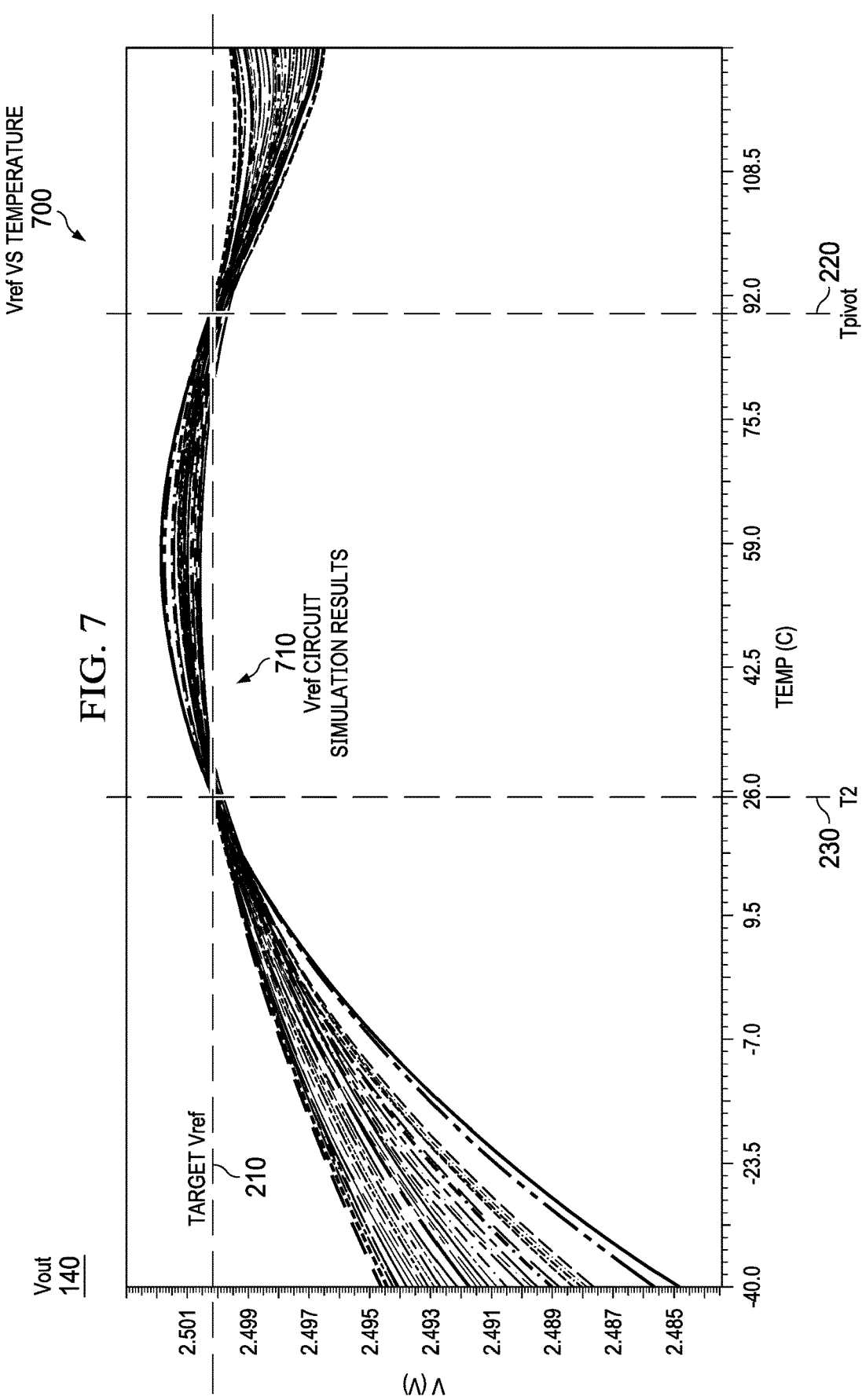
FIG. 7 illustrates an example application of the voltage reference circuit of FIG. 3, 4 or 5.

FIG. 7 illustrates simulation results 700 showing output voltage stability over temperature for the voltage reference circuit of FIG. 3 after two-temperature trimming. Each curve of the Vref circuit simulation results 710 shows variance of the output voltage 140 from the target reference voltage 210, which in this example is 2.5 volts. As shown, the variance reaches a minimum at the two-temperature settings Tpivot 220 (90° Celsius) and T2 230 (25° Celsius). Within that temperature range (25° to 90°), the variance is less 2 mV. Outside of that temperature range (greater than 90° or less than 25°), the variation increases to as much as 4 mV at 124° and 15 mV at −40°.

Example Applications

Figure 8:
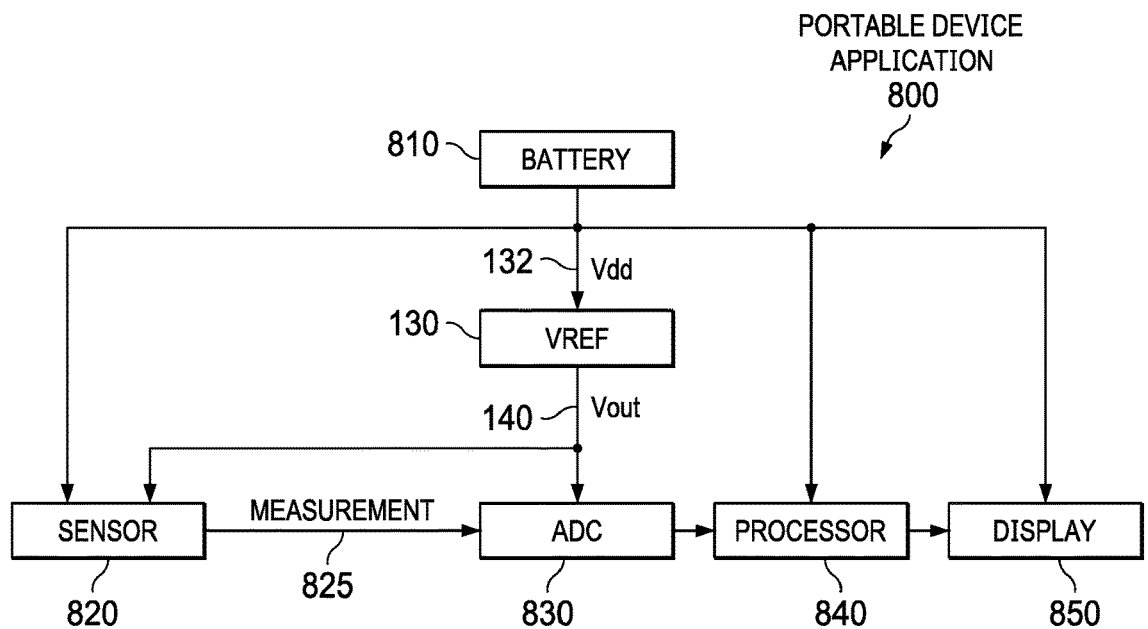
FIG. 8 illustrates another example application of the voltage reference circuit of FIG. 3, 4 or 5.

FIG. 8 illustrates one example application 800 of the voltage reference circuit of FIG. 3, 4 or 5. The illustrated example is a portable device, such as a battery powered handheld measurement device. The battery 810 is configured to provide power to the Vref circuit 130 (as Vdd 132), a sensor 820, a processor 840, and a display device 850. The Vref circuit 130 is configured to provide an accurate and stable reference voltage Vout 140 for use by the sensor 820 and an ADC 830, which may be required for small signal measurements. Because the device is handheld and battery powered, the relatively low Iq provided by the described Vref 130 is also beneficial in this application. The sensor 820 is configured to generate an analog measurement signal 825 which is converted into a digital signal by ADC 830 to be supplied to the processor 840. The processor may then manipulate the signal by performing any suitable signal processing functions, such as averaging, filtering, etc., and then provide results for visual display.

Figure 9:
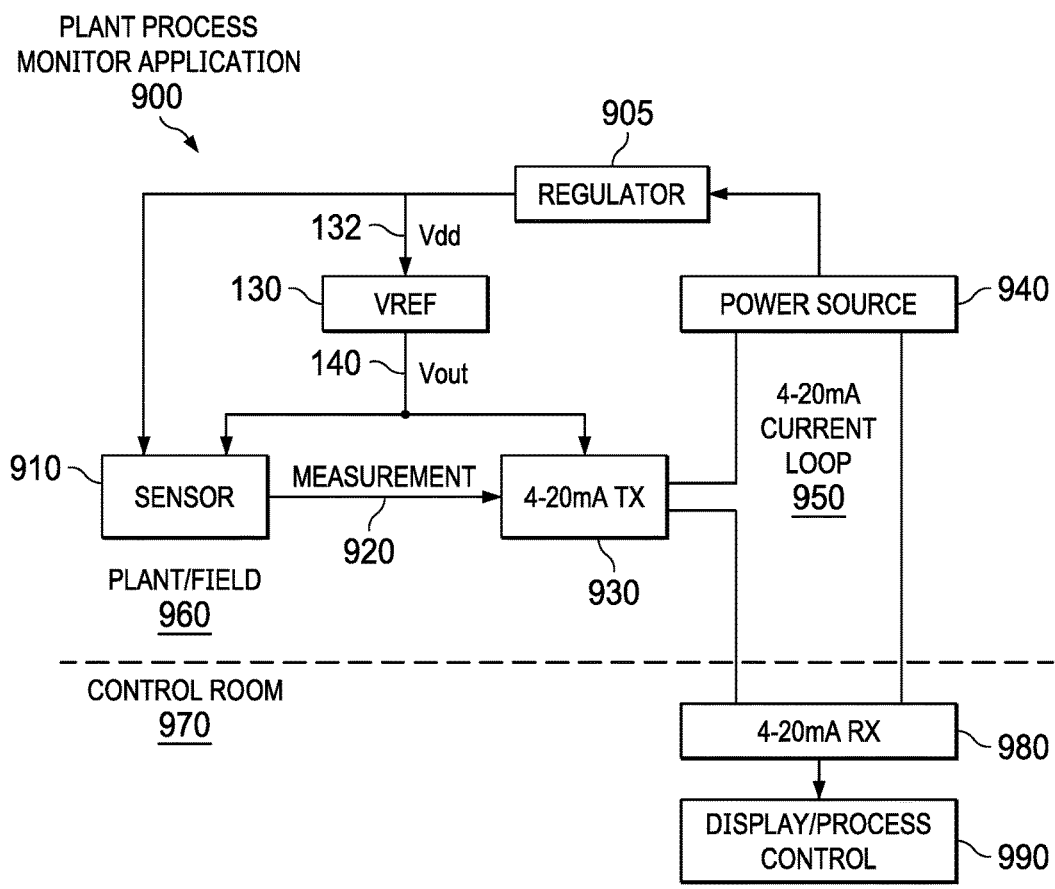
FIG. 9 illustrates another example application of the voltage reference circuit of FIG. 3, 4 or 5.

FIG. 9 illustrates another example application 900 of the voltage reference circuit of FIG. 3, 4 or 5. The illustrated example is an industrial plant process monitoring application, in which a processing condition is monitored by a sensor 910 in the plant or field 960, and the measurements 920 are transmitted back to a control room 970. The measurements are transmitted using a current loop 950, in which the message is encoded in a current signal that ranges from 4 milliamps (mA) to 20 mA. A power source 940 is configured to provide power to a voltage regulator 905, which is configured to provide a voltage (Vdd 132) to the Vref circuit 130 and to the sensor 910. The Vref circuit 130 is configured to provide an accurate and stable reference voltage Vout 140 for use by the sensor 910 and the 4-20 mA signal transmitter 930. The power source 940 is configured to provide a coarse voltage that drives the 4-20 mA current loop 950, while the 4-20 mA transmitter 930 is configured to modulate the current flow through the loop 950 with relatively high accuracy.

On the control room side 970, a 4-20 mA receiver 980 is configured to decode the message from the received current in the current loop 950. The decoded message, which represents the sensor measurement 920, is then passed to a display or process controller 990 for further control of the industrial process.

FURTHER EXAMPLE EMBODIMENTS

Example 1 is an integrated circuit (IC) including: a differential amplifier stage configured to generate a control signal, the differential amplifier stage including a first resistor ($R_{DEGEN}$) and a second resistor ($R_{PTAT}$); and a scaling amplifier stage coupled to the differential amplifier stage and configured to generate a reference voltage at an output port of the IC based on the control signal, the scaling amplifier stage including a first resistor (R1) and a second resistor (R2). $R_{DEGEN}$ and R1 are trimmable to set current flow through the differential amplifier stage and the scaling amplifier stage, at a first temperature. R2 is trimmable to set a voltage at the output port to the reference voltage, at the first temperature. $R_{PTAT}$ is trimmable to set the voltage at the output port to the reference voltage, at a second temperature.

Example 2 includes the subject matter of Example 1. The scaling amplifier stage includes a third resistor ($R1_{PTAT}$) coupled in series to R1 and a fourth resistor ($R2_{PTAT}$) coupled in series to R2. $R1_{PTAT}$ and $R2_{PTAT}$ are trimmable to set the voltage at the output port to the reference voltage at the second temperature.

Example 3 includes the subject matter of Example 2. A trim value for $R1_{PTAT}$ is set to a trim value for $R_{PTAT}$ and a trim value of $R2_{PTAT}$ is set to a negative of the trim value of $R_{PTAT}$.

Example 4 includes the subject matter of any one of Examples 1 through 3. Example 4 includes a switch (SW) configured to provide a connection between the differential amplifier stage and the scaling amplifier stage, responsive to toggling the switch from an open state to a closed state, in which the voltage at the output port varies responsive to the toggling of the switch to indicate that the current flow through the differential amplifier stage differs from the current flow through the scaling amplifier stage.

Example 5 includes the subject matter of any one of Examples 1 through 4. The differential amplifier stage includes: a first transistor (N1); a second transistor (N2); and a third resistor ($R_{INULL1}$). A first terminal of $R_{DEGEN}$ is coupled to a source terminal of N1 and to a source terminal of N2. A second terminal of $R_{DEGEN}$ is coupled to a gate terminal of N1 and to a first terminal of $R_{PTAT}$. A second terminal of $R_{PTAT}$ is coupled to a first terminal of $R_{INULL1}$ and to a first terminal of SW. A second terminal of $R_{INULL1}$ is coupled to ground.

Example 6 includes the subject matter of any one of Examples 1 through 5. The scaling amplifier stage includes: a transistor (P3); and a fifth resistor ($R_{INULL2}$). A first terminal of R2 is coupled to a drain terminal of P3 and to the output port. A second terminal of R2 is coupled to a first terminal of $R2_{PTAT}$. A second terminal of $R2_{PTAT}$ is coupled a gate terminal of N2 and to a first terminal of R1. A second terminal of R1 is coupled to a first terminal of $R1_{PTAT}$. A second terminal of $R1_{PTAT}$ is coupled to a second terminal of SW and to a first terminal of $R_{INULL2}$. A second terminal of $R_{INULL2}$ is coupled to ground.

Example 7 includes the subject matter of Example 6, in which N1 is an NFET having a gate-to-source voltage threshold within a range of −220 millivolts to −180 millivolts, and P3 is a PFET having a gate-to-source voltage threshold within a range of +540 millivolts to +660 millivolts.

Example 8 includes the subject matter of any one of Examples 1 through 7, in which $R_{DEGEN}$ and R1 are trimmable to equalize the current flow through the differential amplifier stage and the scaling amplifier stage at the first temperature.

Example 9 is a method for trimming a voltage reference circuit. The method includes: setting the voltage reference circuit to a first temperature; trimming a first resistor ($R_{DEGEN}$) of a differential amplifier stage of the voltage reference circuit and trimming a first resistor (R1) of a scaling amplifier stage of the voltage reference circuit, the trimming to set current flow through the differential amplifier stage and the scaling amplifier stage; trimming a second resistor (R2) of the scaling amplifier stage to set an output voltage of the voltage reference circuit to a target voltage at the first temperature; setting the voltage reference circuit to a second temperature; and trimming a second resistor ($R_{PTAT}$) of the differential amplifier stage to set the output voltage of the voltage reference circuit to the target voltage at the second temperature.

Example 10 includes the subject matter of Example 9, and includes: trimming a third resistor ($R1_{PTAT}$) of the scaling amplifier stage by a trim value of $R_{PTAT}$; and trimming a fourth resistor ($R2_{PTAT}$) of the scaling amplifier stage by a negative of the trim value of $R_{PTAT}$.

Example 11 includes the subject matter of Example 9 or 10, and includes: toggling a switch between an open state and a closed state, in which the closed state provides a connection between the differential amplifier stage and the scaling amplifier stage; and determining that the current flow through the differential amplifier stage differs from the current flow through the scaling amplifier stage based on detection of a change in the output voltage responsive to the toggling.

Example 12 includes the subject matter of any one of Examples 9 through 11, and includes: trimming $R_{DEGEN}$ and R1 to equalize the current flow through the differential amplifier stage and the scaling amplifier stage at the first temperature.

Example 13 includes the subject matter of any one of Examples 9 through 12, and includes selecting the first temperature and the second temperature based on an operational temperature range of the voltage reference circuit.

Example 14 includes the subject matter of any one of Examples 9 through 13, in which the first temperature is higher than the second temperature.

Example 15 is a measurement system including: a voltage reference circuit configured to provide a reference voltage based on an input voltage; a sensor coupled to the voltage reference circuit, the sensor configured to provide an analog measurement signal responsive to the reference voltage; and an analog to digital converter (ADC) configured to convert the analog measurement signal into a digital signal responsive to the reference voltage. The voltage reference circuit includes a differential amplifier stage configured to generate a control signal. The differential amplifier stage includes a first resistor ($R_{DEGEN}$) and a second resistor ($R_{PTAT}$). A scaling amplifier stage is coupled to the differential amplifier stage and is configured to generate the reference voltage at an output port of the circuit based on the control signal. The scaling amplifier stage includes a first resistor (R1) and a second resistor (R2). $R_{DEGEN}$ and R1 are trimmable to set current flow through the differential amplifier stage and the scaling amplifier stage, at a first temperature. R2 is trimmable to set a voltage at the output port to the reference voltage, at the first temperature. $R_{PTAT}$ is trimmable to set the voltage at the output port to the reference voltage, at a second temperature.

Example 16 includes the subject matter of Example 15, in which the input voltage is a battery voltage.

Example 17 includes the subject matter of Example 15 or 16, in which the scaling amplifier stage includes a third resistor ($R1_{PTAT}$) coupled in series to R1 and a fourth resistor ($R2_{PTAT}$) coupled in series to R2. $R1_{PTAT}$ and $R2_{PTAT}$ are trimmable to set the voltage at the output port to the reference voltage at the second temperature.

Example 18 includes the subject matter of Example 17, in which a trim value for $R1_{PTAT}$ is set to a trim value for $R_{PTAT}$, and a trim value of $R2_{PTAT}$ is set to a negative of the trim value of $R_{PTAT}$.

Example 19 includes the subject matter of any one of Examples 15 through 18, in which the voltage reference circuit includes a switch (SW) configured to provide a connection between the differential amplifier stage and the scaling amplifier stage, responsive to toggling the switch from an open state to a closed state, and the voltage at the output port varies responsive to the toggling of the switch to indicate that the current flow through the differential amplifier stage differs from the current flow through the scaling amplifier stage.

Example 20 includes the subject matter of any one of Examples 15 through 19, in which the differential amplifier stage includes: a first transistor (N1); a second transistor (N2); and a third resistor ($R_{INULL1}$). A first terminal of $R_{DEGEN}$ is coupled to a source terminal of N1 and to a source terminal of N2. A second terminal of $R_{DEGEN}$ is coupled to a gate terminal of N1 and to a first terminal of $R_{PTAT}$. A second terminal of $R_{PTAT}$ is coupled to a first terminal of $R_{INULL1}$ and to a first terminal of SW. A second terminal of $R_{INULL1}$ is coupled to ground.

Example 21 includes the subject matter of Example 20, in which the scaling amplifier stage includes: a transistor (P3); and a fifth resistor ($R_{INULL2}$). A first terminal of R2 is coupled to a drain terminal of P3 and to the output port. A second terminal of R2 is coupled to a first terminal of $R2_{PTAT}$. A second terminal of $R2_{PTAT}$ is coupled a gate terminal of N2 and to a first terminal of R1. A second terminal of R1 is coupled to a first terminal of $R1_{PTAT}$. A second terminal of $R1ptat$ is coupled to a second terminal of SW and to a first terminal of $R_{INULL2}$. A second terminal of $R_{INULL2}$ is coupled to ground.

Example 22 includes the subject matter of Example 21, in which N1 is an NFET having a gate-to-source voltage threshold within a range of −220 millivolts to −180 millivolts, and P3 is a PFET having a gate-to-source voltage threshold within a range of +540 millivolts to +660 millivolts.

Example 23 includes the subject matter of any one of Examples 15 through 22, in which $R_{DEGEN}$ and R1 are trimmable to equalize the current flow through the differential amplifier stage and the scaling amplifier stage at the first temperature.

Modifications are possible in the described embodiments, and other embodiments are possible, within the scope of the claims.

What is claimed is:

1. An integrated circuit (IC) comprising:
   a differential amplifier stage including first and second resistors, the differential amplifier stage configured to provide a control signal; and
   a scaling amplifier stage coupled to the differential amplifier stage and including third and fourth resistors, the scaling amplifier stage configured to provide a reference voltage at an output port responsive to the control signal;
   in which:
   resistances of the first and third resistors are adjustable to set a current through the differential amplifier stage and the scaling amplifier stage at a first temperature;
   a resistance of the fourth resistor is adjustable to set a voltage at the output port equal to the reference voltage at the first temperature; and
   a resistance of the second resistor is adjustable to set the voltage at the output port equal to the reference voltage at a second temperature.

2. The IC of claim 1, wherein the scaling amplifier stage includes fifth and sixth resistors, the fifth resistor is coupled in series with the third resistor, the sixth resistor is coupled in series with the fourth resistor, and the resistances of the fifth and sixth resistors are adjustable to set the voltage at the output port equal to the reference voltage at the second temperature.

3. The IC of claim 2, wherein the resistance of the fifth resistor is trimmed by an equal amount as the second resistor, and the resistance of the sixth resistor is trimmed by an equal amount in an opposite direction as the second resistor.

4. The IC of claim 2, further comprising a switch coupled between the differential amplifier stage and the scaling amplifier stage, in which the voltage at the output port varies responsive to a toggling of the switch to indicate that the current through the differential amplifier stage differs from the current through the scaling amplifier stage.

5. The IC of claim 4, wherein the differential amplifier stage includes:
   a first transistor having a first current terminal and a first gate, wherein the first current terminal is coupled to a first terminal of the first resistor, and the first gate is coupled to a second terminal of the first resistor and to the second resistor;

a second transistor having a second current terminal and a second gate, wherein the second current terminal is coupled to the first terminal of the first resistor, and the second gate is coupled to the sixth resistor; and a seventh resistor coupled between the second resistor and ground.

6. The IC of claim 5, wherein the scaling amplifier stage includes:

a third transistor having a third current terminal and a third gate, wherein the third current terminal is coupled to the output port and to the fourth resistor; and an eighth resistor coupled between the fifth resistor and ground.

7. The IC of claim 6, wherein the first transistor is an NFET having a gate-to-source voltage threshold within a range of −220 millivolts to −180 millivolts, and the third transistor is a PFET having a gate-to-source voltage threshold within a range of +540 millivolts to +660 millivolts.

8. The IC of claim 1, wherein the first resistor and the third resistor are each adjustable to equalize the current through the differential amplifier stage and the scaling amplifier stage at the first temperature.

9. A method for trimming a voltage reference circuit, the method comprising:

setting a temperature of the voltage reference circuit to a first temperature;

trimming first and second resistors to set a current through a differential amplifier stage and a scaling amplifier stage, wherein the differential amplifier stage includes the first resistor, and the scaling amplifier stage includes the second resistor;

trimming a third resistor to set an output voltage to a target voltage at the first temperature, wherein the third resistor is included in the scaling amplifier stage;

setting the temperature of the voltage reference circuit to a second temperature; and trimming a fourth resistor by a value of P1 to set the output voltage to the target voltage, wherein the fourth resistor is included in the differential amplifier stage.

10. The method of claim 9, further comprising:

trimming a fifth resistor by the value P1, wherein the fifth resistor is included in the scaling amplifier stage; and trimming a sixth resistor by a value of −P1, wherein the sixth resistor is included in the scaling amplifier stage.

11. The method of claim 9, further comprising:

toggling a switch between an open state and a closed state, in which the closed state connects the differential amplifier stage to the scaling amplifier stage; and determining that the current through the differential amplifier stage differs from the current through the scaling amplifier stage responsive to detecting a change in the output voltage as a result of the toggling.

12. The method of claim 9, further comprising trimming the first and third resistors to equalize the current through the differential amplifier stage and the scaling amplifier stage at the first temperature.

13. The method of claim 9, in which the first temperature and the second temperature are set based on an operational temperature range of the voltage reference circuit.

14. The method of claim 9, wherein the first temperature is higher than the second temperature.

15. A measurement system comprising:

a voltage reference circuit having a reference input and a reference output, wherein the reference input is coupled to an input voltage terminal, and the voltage reference circuit is configured to provide a reference voltage at the reference output;

a sensor having a sensor input and a sensor output, wherein the sensor input is coupled to the reference output, and the sensor is configured to provide an analog measurement signal at the sensor output proportional to the reference voltage; and an analog to digital converter (ADC) having an ADC input and an ADC output, wherein the ADC input is coupled to the sensor output, and the ADC is configured to provide a digital signal proportional to the reference voltage;

in which the voltage reference circuit includes:

a differential amplifier stage including first and second resistors, the differential amplifier stage configured to provide a control signal; and a scaling amplifier stage coupled to the differential amplifier stage and including third and fourth resistors, wherein the scaling amplifier is configured to provide the reference voltage at an output port responsive to the control signal;

wherein:

the first and third resistors are trimmable to set a current through the differential amplifier stage and the scaling amplifier stage at a first temperature, the fourth resistor is trimmable to set a voltage at the output port to the reference voltage at the first temperature, and the second resistor is trimmable to set the voltage at the output port to the reference voltage at a second temperature.

16. The measurement system of claim 15, wherein a voltage at the input voltage terminal is supplied by a battery.

17. The measurement system of claim 15, wherein the scaling amplifier stage includes a fifth resistor coupled in series with the third resistor, and a sixth resistor coupled in series with the fourth resistor, and the fifth and sixth resistors are trimmable to set the voltage at the output port to the reference voltage at the second temperature.

18. The measurement system of claim 17, wherein a resistance of the fifth resistor is trimmed by an equal amount as a resistance of the second resistor, and a resistance of the sixth resistor is trimmed by an equal amount in an opposite direction as the resistance of the second resistor.

19. The measurement system of claim 17, wherein the voltage reference circuit includes a switch configured to selectively connect the differential amplifier stage to the scaling amplifier stage, and the voltage at the output port varies responsive to the toggling of the switch to indicate that the current through the differential amplifier stage differs from the current through the scaling amplifier stage.

20. The measurement system of claim 19, wherein the differential amplifier stage includes:

a first transistor having a first current terminal and a first gate, wherein the first current terminal is coupled to a first terminal of the first resistor, and the first gate is coupled to a second terminal of the first resistor and to the second resistor;

a second transistor having a second current terminal and a second gate, wherein the second current terminal is coupled to the first terminal of the first resistor, and the second gate is coupled to the sixth resistor; and a seventh resistor coupled between the second resistor and ground.

21. The measurement system of claim 20, wherein the scaling amplifier stage includes:

a third transistor having a third current terminal and a third gate, wherein the third current terminal is coupled to the output port and to the fourth resistor; and a seventh resistor coupled between the second resistor and ground.

22. The measurement system of claim 21, wherein the first transistor is an NFET having a gate-to-source voltage threshold within a range of −220 millivolts to −180 millivolts, and the third transistor is a PFET having a gate-to-source voltage threshold within a range of +540 millivolts to +660 millivolts.

23. The measurement system of claim 15, wherein the first and third resistors are trimmable to equalize the current through the differential amplifier stage and the scaling amplifier stage at the first temperature.

* * * * *